Figure 1:
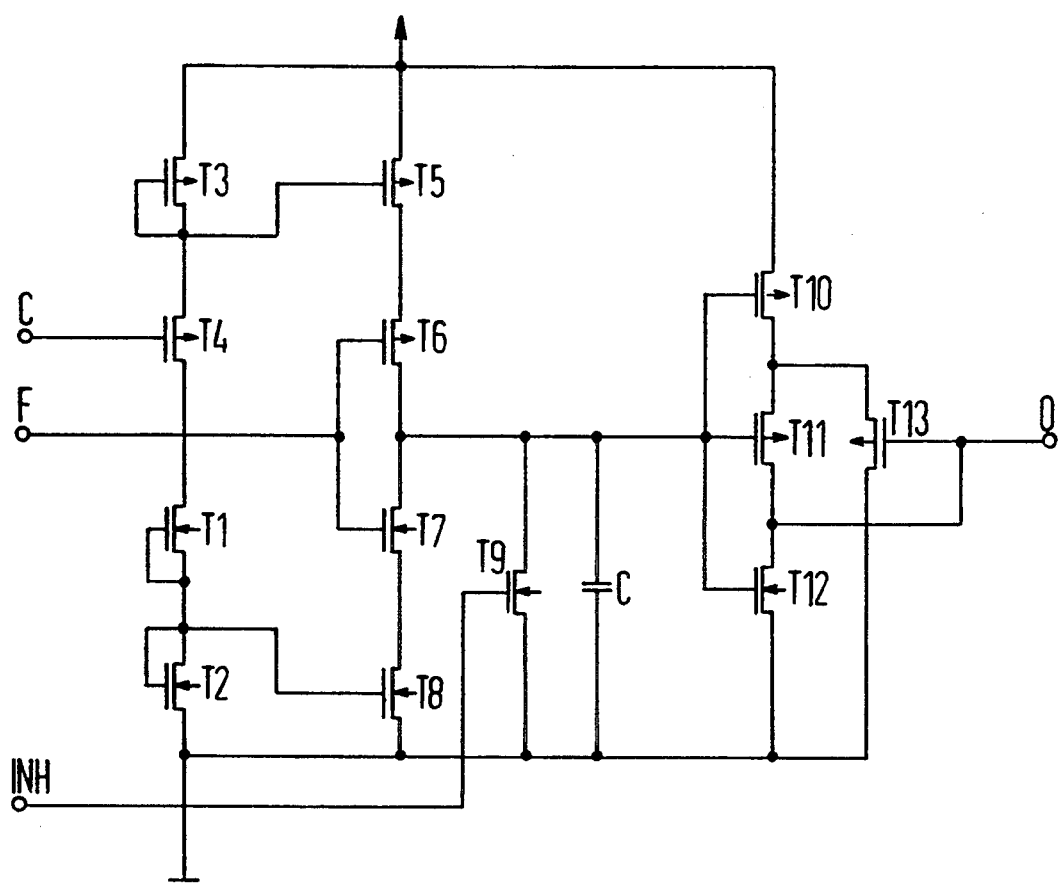

United States Patent [19]

Massoner

[11] Patent Number: 5,382,840
[45] Date of Patent: Jan. 17, 1995

[54] ANALOG DELAY CIRCUIT CONFIGURATION

[75] Inventor: Johann Massoner, Villach, Austria

[73] Assignee: Siemens Aktiengesellschaft, Munich, Germany

[21] Appl. No.: 954,377

[22] Filed: Sep. 30, 1992

[30] Foreign Application Priority Data

Sep. 30, 1991 [DE] Germany .................... 4132517

[51] Int. Cl.⁶ ......................................... H03H 11/26
[52] U.S. Cl. ..................................... 327/206; 327/399
[58] Field of Search ............... 307/270, 290, 600, 603, 307/605

[56] References Cited

U.S. PATENT DOCUMENTS

| | | | |
|---|---|---|---|
| 4,812,687 | 3/1989 | Larson et al. ............... | 307/290 X |
| 4,837,466 | 6/1989 | Kanauchi ..................... | 307/605 |
| 5,006,738 | 4/1991 | Usuki et al. .................. | 307/605 X |
| 5,028,824 | 7/1991 | Young .......................... | 307/603 |
| 5,057,722 | 10/1991 | Kobatake ..................... | 307/605 |
| 5,300,837 | 4/1994 | Fischer ........................ | 307/605 X |

*Primary Examiner*—Willis R. Wolfe
*Attorney, Agent, or Firm*—Herbert L. Lerner; Laurence A. Greenberg

[57] ABSTRACT

An analog delay circuit configuration includes a switching stage. A capacitor is connected upstream of the switching stage. A controlled current source has a current being definitive for a charging state of the capacitor. The current source is clocked with a pulse-to-interval ratio of less than 1. A current mirror configuration reduces the current of the current source. An inverter stage is coupled to the current mirror configuration and has an output side connected to the capacitor.

6 Claims, 1 Drawing Sheet

ANALOG DELAY CIRCUIT CONFIGURATION

SPECIFICATION

The invention relates to an analog delay circuit configuration having a controlled current source with a current being definitive for a charging state of a capacitor having a switching stage connected downstream thereof.

Particularly in connection with applications in power electronics, it is often necessary to use delay circuits which suppress useful signals, especially in switching events of the power switches, in order to prevent malfunctions. As soon as the switching event of the high-current switch has been concluded, the circuit is supposed to operate normally without additional delay. In high-current switches of the kind increasingly being used in automotive electronics, for example, distinctions are made between switches that switch the positive supply voltage branch with respect to the load (high side switches) and those that switch the negative supply voltage branch (low side switches). Accordingly, p-channel transistors are used for high side switches, and n-channel transistors are used for low side switches.

Charge pumps are typically used in particular for high side switches, since the p-channel transistors require a gate voltage that is above the positive supply voltage for optimal switching performance. Such charge pumps require oscillator stages. In low side switches as well, for which DMOS transistors are typically used, it is often necessary to select the gate voltage to be as high as possible, so that the load path will have the lowest possible impedance. Charge pumps are suitable for this purpose as well.

Depending on the embodiment of the power switches, the useful signals must be delayed by between one and ten milliseconds, or suppressed. Typically, either counter stages or capacitor-resistor configurations with a suitably selected time constant are used as delay circuits. In power technologies, both versions require an extraordinary amount of surface area.

It is accordingly an object of the invention to provide an analog time delay circuit configuration, which overcomes the hereinafore-mentioned disadvantages of the heretofore-known devices of this general type and which requires less semiconductor surface space.

With the foregoing and other objects in view there is provided, in accordance with the invention, an analog delay circuit configuration, comprising a switching stage, a capacitor connected upstream of the switching stage, a controlled current source having a current being definitive for a charging state of the capacitor, the current source being clocked with a pulse-to-interval ratio of less than 1, a current mirror configuration reducing the current of the current source, and an inverter stage being coupled to the current mirror configuration and having an output side connected to the capacitor.

An advantage of the invention is that because of the selection of the pulse-to-interval ratio and of the current mirror geometry, the charging or discharging current of the capacitor can be adjusted in accordance with the desired delay time, in such a way that the capacitor can be small and the transistor surface areas can be minimal, even with long delay times.

In accordance with another feature of the invention, the clocked current source includes a series circuit of a transistor connected as a resistor and a switching transistor.

In accordance with a further feature of the invention, the current mirror configuration includes a current mirror for a charging circuit and/or a current mirror for a discharging circuit of the capacitor.

In accordance with a concomitant feature of the invention, there is provided a Schmitt trigger configuration connected downstream of the capacitor.

Other features which are considered as characteristic for the invention are set forth in the appended claims.

Although the invention is illustrated and described herein as embodied in an analog delay circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
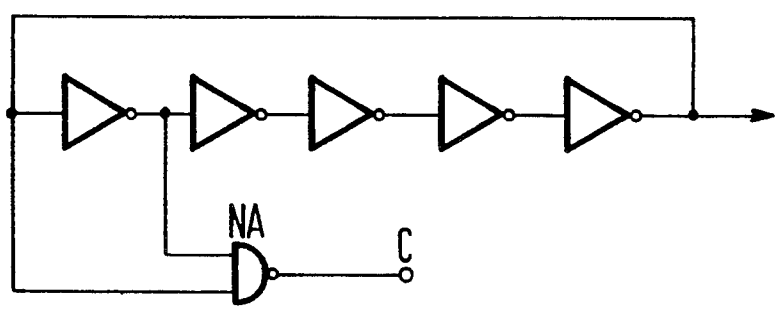

FIG. 1 is a basic schematic circuit diagram of a delay circuit configuration according to the invention; and FIG. 2 is a basic circuit diagram for generating a pulse-to-interval signal.

Referring now to the figures of the drawing in detail and first, particularly, to FIG. 1 thereof, there is seen a circuit configuration which includes a current source configuration having transistors T1-T4. The output circuits of these transistors are connected in series and are supplied by a voltage source. The actual current source is formed by the transistor T1, which defines the current flowing through the branch. The transistor T1 is constructed as an MOS field-effect transistor of the depletion type. The current flowing through therefore becomes independent of the supply voltage. It is clear that other ways of providing the current source may also be used, such as a high-impedance resistor or a suitably switched transistor of the enrichment type. The transistor T4, which is in series with the transistor T1, is responsible for clocking the current source. To that end, the gate lead of the transistor T4 is triggered by a clock signal that is applied to a terminal C. Provision is made for the clock signal to have a pulse-to-interval ratio of less than 1, for example less than 1:10. This assures that the current defined by the transistor T1 can only flow through the branch at certain times. In the exemplary embodiment, the transistor T4 is constructed as a p-channel transistor.

A clock signal for triggering the transistor T4 can be generated with a circuit in accordance with FIG. 2, for example. This circuit includes a chain of inverters, which are not identified by reference numerals. The chain has an input and an output which is fed back to the input. This produces an oscillator stage with an output side which can lead to a charge pump. Input and output signals of an inverter form input signals of a NAND gate NA, having an output side at which the clock signal required for triggering the transistor T4, having a predetermined pulse-to-interval ratio, can be picked up. In configurations that already have an oscillator for a charge pump, generating the clock signal accordingly requires only little effort and expense.

The currents generated by the clocked current source having the transistors T1 and T4 are mirrored through a current mirror configuration into an inverter configuration having transistors T5–T8. The transistors T5–T8 are connected in series on the output side and are supplied by the voltage source. The actual inverters are formed by the transistors T6 and T7, which are constructed as complementary MOS transistors. To that end, the transistor T6 is a p-channel transistor, the transistor T7 is an n-channel transistor and the gates of the transistors T6 and T7 are connected to .one another and to an input F. The output of the inverter stage is formed by a connection point between the output circuits of the two transistors T6 and T7. A current mirror configuration for coupling-in the clocked current of the current source is formed by two current mirrors, one including the transistors T3 and T5, and the other including the transistors T2 and T8. The transistor T3 is connected as a diode. A connection point between the gate and the drain of the transistor T3 is connected to the gate of the transistor T5. The transistor T2 is correspondingly connected as a diode, and its gate and drain leads are connected to the gate lead of the transistor T8. With the aid of the current translation ratio defined by the current mirror geometry, or in other words the geometry of the respective transistors T3, T5 and T2, T8, the current of the current source is mirrored into the inverter circuit at a certain ratio. According to the invention, a lesser current flows in the inverter circuit than is generated by the current source. For example, the reduction factor may be 10 or more, as referred to the current of the current source. Naturally, different current translation ratios of the two current mirrors may be provided. Depending on the control signal at the terminal F, either the transistor T6 or the transistor T7 is made conducting, so that correspondingly the partial circuit including the transistors T5 and T6, or the partial circuit including the transistors T7 and T8, carries current.

At the output of the inverter stage, a capacitor C is connected toward one pole of the supply voltage source. Depending on the switching state of the inverter, the capacitor C is charged or discharged through a very low clocked current mirrored into the inverter circuit by the current source. If a pulse-to-interval ratio of 1:10 and a current translation ratio of the current mirrors of 10:1 are selected, then the charging current or discharging current of the capacitor is reduced by a factor of 100, as compared with a corresponding constant current of the kind furnished by the transistor T1.

The inverter stage or a connecting point between the inverter stage and the capacitor C, is followed by a Schmitt trigger having transistors T10–T13, which has an output side forming the output of the delay circuit. The Schmitt trigger becomes conducting very rapidly as soon as its switching point is reached. In FIG. 1, the switching point is determined by the charging state of the capacitor C. As a result of the low charging or discharging current for the capacitor C, the charging time until the switching point is prolonged accordingly, as compared with a capacitor charged with constant current. This means that the capacitor C can be dimensioned correspondingly smaller as compared with a capacitor charged with constant current, for attaining the same delay time until the switching point of the Schmitt trigger. The invention not only makes it possible to have the smaller-sized capacitor C, but also to use transistors with a minimized surface area for the inverter or charging stage. If the charging or discharging current were not reduced, the transistors T5–T8 would have to be comparatively long and thus would require correspondingly more surface area. The switching stage formed by the Schmitt trigger enables a speeding up of the delayed switching edge since it becomes conducting quickly.

In the exemplary embodiment of FIG. 1, both the positive and the negative going edge can be controlled through the control of the charging or discharging current of the capacitor. In contrast, if only the turn-on or turn-off is to be delayed, then the corresponding current mirrors including the transistors T2 and T8, and T3 and T5, can be omitted. A transistor T9 that has an output circuit connected parallel to the capacitor C in FIG. 1, can bypass the transistors T7 and T8, given a suitable input signal at its gate lead INH. Fast charging of the capacitor C can thus be attained. If the current mirror including the transistors T2 and T8 is not needed, then the transistor T9 can be omitted as well.

I claim:

1. An analog delay circuit configuration, comprising a switching stage, a capacitor connected upstream of said switching stage, a controlled current source having a current being definitive for a charging state of said capacitor, said current source being clocked with a pulse-to-interval ratio of less than 1, a current mirror configuration reducing the current of said current source, and an inverter stage being coupled to said current mirror configuration and having an output side connected to said capacitor.

2. The configuration according to claim 1, wherein said clocked current source includes a series circuit of a transistor connected as a resistor and a switching transistor.

3. The configuration according to claim 1, wherein said current mirror configuration includes a current mirror for a charging circuit of said capacitor.

4. The configuration according to claim 1, wherein said current mirror configuration includes a current mirror for a discharging circuit of said capacitor.

5. The configuration according to claim 1, wherein said current mirror configuration includes a current mirror for a charging circuit and a current mirror for a discharging circuit of said capacitor.

6. The configuration according to claim 1, including a Schmitt trigger configuration connected downstream of said capacitor.

* * * * *